(12) United States Patent
Lee et al.

(10) Patent No.: US 8,077,506 B2
(45) Date of Patent: Dec. 13, 2011

(54) METHOD FOR PROGRAMMING A MULTILEVEL PHASE CHANGE MEMORY DEVICE

(75) Inventors: Ming-Hsiu Lee, Hsinchu (TW);
Yi-Chou Chen, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 12/969,526

(22) Filed: Dec. 15, 2010

(65) Prior Publication Data

US 2011/0080780 A1    Apr. 7, 2011

Related U.S. Application Data

(63) Continuation of application No. 12/639,789, filed on Dec. 16, 2009, now Pat. No. 7,876,608, which is a continuation of application No. 11/894,869, filed on Aug. 21, 2007, now Pat. No. 7,656,701, which is a continuation of application No. 10/976,648, filed on Oct. 29, 2004, now Pat. No. 7,272,037.

(51) Int. Cl.
*G11C 11/00*    (2006.01)

(52) U.S. Cl. .......................................... 365/163; 365/148

(58) Field of Classification Search .................. 365/163, 365/158, 171, 117, 65, 225.5
See application file for complete search history.

(56) References Cited

U.S. PATENT DOCUMENTS

| | | | |
|---|---|---|---|
| 3,530,441 A | 9/1970 | Ovshinsky | |
| 4,744,055 A | 5/1988 | Hennessey | |
| 6,545,903 B1 | 4/2003 | Wu | |
| 6,646,902 B2 | 11/2003 | Gilton et al. | |
| 6,714,954 B2 | 3/2004 | Ovshinsky et al. | |
| 6,816,404 B2 | 11/2004 | Khouri et al. | |
| 6,928,022 B2 * | 8/2005 | Cho et al. | 365/225.7 |
| 6,963,893 B2 | 11/2005 | Ovshinsky et al. | |
| 6,967,865 B2 * | 11/2005 | Lee | 365/163 |
| 6,985,389 B2 | 1/2006 | Ma | |
| 7,057,920 B2 * | 6/2006 | Perner et al. | 365/158 |
| 7,075,841 B2 | 7/2006 | Resta et al. | |
| 7,085,154 B2 | 8/2006 | Cho et al. | |
| 7,123,535 B2 | 10/2006 | Kurotsuchi et al. | |

(Continued)

OTHER PUBLICATIONS

K.F. Strauss et al. "Overview of Radiation Tolerant Unlimited Write Cycle Non-Volatile Memory" 2000 IEEE, 10 Pages.
S. Lai et al. "OUM—A 180 nm Nonvolatile Memory Cell Element Technology for Stand Alone and Embedded Applications" IEDM Dig. (2001), 5 pages.

*Primary Examiner* — Gene N Auduong
(74) *Attorney, Agent, or Firm* — Stout, Uxa, Buyan & Mullins, LLP

(57) ABSTRACT

A method of programming a phase change device includes selecting a desired threshold voltage (Vth) and applying a programming pulse to a phase change material in the phase change device. The applying of the programming pulse includes applying a quantity of energy to the phase change material to drive at least a portion of this material above a melting energy level. A portion of the energy applied to the phase change material is allowed to dissipate below the melting energy level. The shape of the energy dissipation from the phase change material is controlled until the energy applied to the phase change material is less than a quenched energy level, to cause the phase change device to have the desired Vth. A remaining portion of the energy applied to the phase change material is allowed to dissipate to an environmental level.

5 Claims, 7 Drawing Sheets

U.S. PATENT DOCUMENTS 7,180,771 B2 2/2007 Cho et al.
7,251,157 B2 * 7/2007 Osada et al. .................. 365/163
7,335,907 B2 2/2008 Terao et al.
2003/0185047 A1 10/2003 Khouri et al.
2004/0246804 A1 12/2004 Cho et al.
2008/0002481 A1 1/2008 Gogl et al.

* cited by examiner

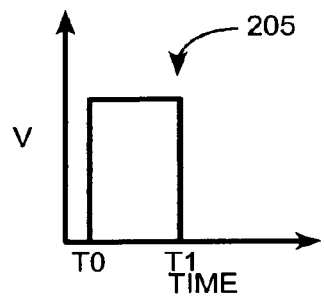
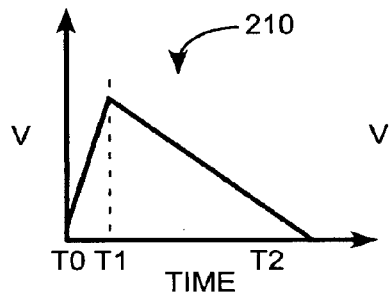
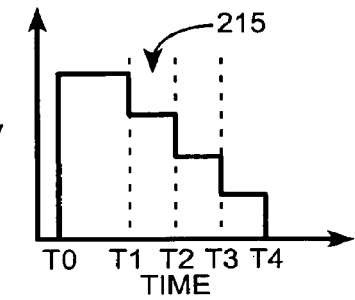
FIGURE 2A  FIGURE 2B  FIGURE 2C
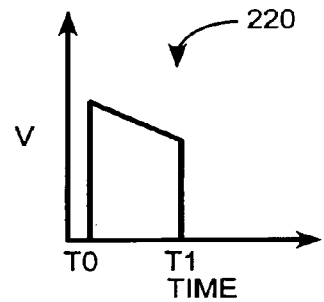
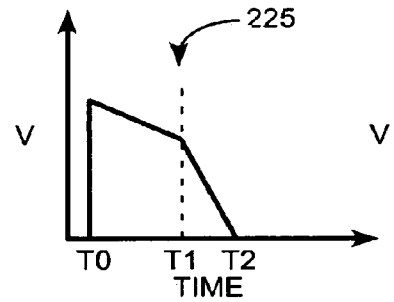
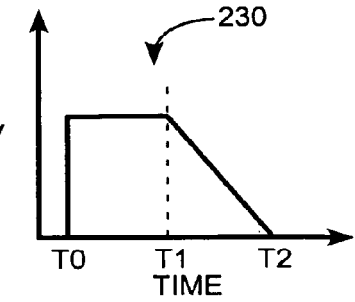
FIGURE 2D  FIGURE 2E  FIGURE 2F
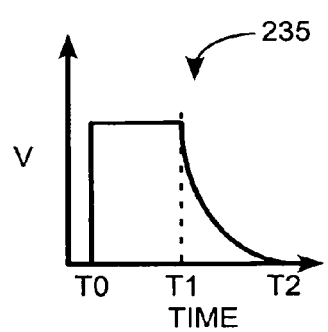
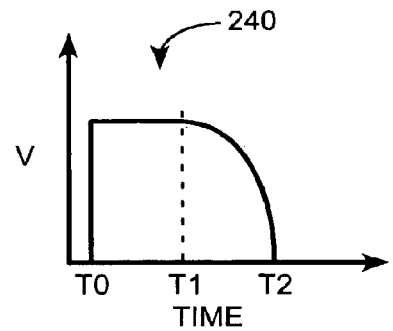
FIGURE 2G  FIGURE 2H

METHOD FOR PROGRAMMING A MULTILEVEL PHASE CHANGE MEMORY DEVICE

CROSS REFERENCE TO RELATED APPLICATIONS

This application is a continuation of U.S. application Ser. No. 12/639,789, filed on Dec. 16, 2009, which is a continuation of U.S. application Ser. No. 11/894,869, filed on Aug. 21, 2007, issued as U.S. Pat. No. 7,656,701, which is a continuation of U.S. application Ser. No. 10/976,648, filed on Oct. 29, 2004, issued as U.S. Pat. No. 7,272,037, the entire contents of all which are expressly incorporated herein by reference.

BACKGROUND OF THE INVENTION

1. Field of the Invention

The present invention relates generally to memory systems, and more particularly, to methods, systems and apparatus for programming phase change memory cells.

2. Description of the Related Art

The general concept of utilizing electrically writable and erasable phase change materials (i.e., materials that can be electrically switched between generally amorphous and generally crystalline states) for electronic memory applications is well known in the art. A typical phase change material is a material that has two general states: a generally amorphous state and a generally crystalline state. The phase change material can include one or more chalcogenide compounds that at least partly include one or more of the following materials: Te, Se, Sb, Ni, and Ge and various combinations thereof.

The typical phase change material can be switched from one state to the other by passing an electrical current or other type of energy through the phase change material to cause it to change states. Typically in the first state (e.g., amorphous state), the phase change material has a relatively high resistance and in the second state (e.g., the crystalline state), the phase change material has a relatively low resistance. The resistance ratio between amorphous state and crystalline state is about 1000:1.

As the state of the phase change material can only be changed by a sufficient application of energy (e.g., a programming energy pulse), then the phase change material is generally non-volatile in that it does not require energy to maintain its current state. Further, because the resistance of the phase change material varies with the state (e.g., a low resistance for a crystalline state and a high resistance for an amorphous state), then the phase change material can be reliably used to store binary data such as may be used for a memory cell in a computer or other binary data storage usage.

The programming energy pulse determines the actual resistance of a programmed phase change device. By way of example, a first programming energy pulse (i.e., 1 ms pulse of 1.42 mA) is applied to a phase change device and results in a resistance of 50 ohms. If a second programming energy pulse (i.e., 1 ms pulse of 1.98 mA) applied to the same phase change device a resistance of 500 ohms could result. As a result only very slight variations in the amount of energy (e.g., electrical current in this instance) results in markedly different resistance levels of the phase change device. Further, as the process variations (e.g., film thickness of the phase change material) and the operating parameters (e.g., operating temperature, voltage, etc.) vary, then the energy required to achieve the desired resistance level changes. Therefore, it is difficult to accurately program a phase change device to a selected resistance level.

In view of the foregoing, there is a need for a system and method for accurately and quickly programming multiple data values in a phase change device.

SUMMARY OF THE INVENTION

Broadly speaking, the present invention fills these needs by providing a system and method for accurately and quickly programming multiple threshold voltage levels in a phase change device. It should be appreciated that the present invention can be implemented in numerous ways, including as a process, an apparatus, a system, computer readable media, or a device. Several inventive embodiments of the present invention are described below.

One embodiment provides a method of programming a phase change device includes selecting a desired threshold voltage (Vth) and applying a programming pulse to a phase change material in the phase change device. Applying the programming pulse includes applying a quantity of energy to the phase change material to drive at least a portion of the phase change material above a melting energy level. The quantity of energy is applied for a first time interval. A portion of the energy applied to the phase change material is allowed to dissipate below the melting energy level. A shape of energy dissipation from the phase change material is controlled until the energy applied to the phase change material is less than a quenched energy level. The shape of the energy dissipation is controlled to cause the phase change device to have the desired Vth. A remaining portion of the energy applied to the phase change material is allowed to dissipate to an environmental level.

The energy applied to the phase change material includes at least one of electrical current, heat, light, voltage. The desired Vth level corresponds to a desired data value. The desired Vth level is one of multiple desired Vth levels and each one of the desired Vth levels corresponds to one of a multiple desired data values.

The quantity of the energy applied to the phase change material can be a function of an operating parameter. The operating parameter includes at least one of an operating temperature and an input voltage. The function of the operating parameter can compensate for a variation in the operating parameter.

The quantity of the energy applied to the phase change material can also be a function of a phase change manufacturing process variable. The phase change manufacturing process variable includes at least one of a group consisting of a phase change material type, a film thickness, and a phase change contact size. The function of the phase change manufacturing process variable can compensate for a variation in the phase change manufacturing process variable.

Controlling the shape of the energy dissipation from the phase change material until the energy applied to the phase change material is less than the quenched energy level can also include applying multiple energy sub-pulses. The sub-pulse can have a profile of at least one of a square, a triangle, one or more stairs, a trapezoid, a trapezium, a square with straight sloping pattern, a square with u-shaped tail pattern, a square with a reverse u-shaped tail pattern, and a combination thereof.

The programming pulse can have a profile of at least one of a square, a triangle, one or more stairs, a trapezoid, a trapezium, a square with straight sloping pattern, a square with u-shaped tail pattern, a square with a reverse u-shaped tail pattern, and a combination thereof. The phase change material can include a chalcogenide material.

Another embodiment provides a method of programming a multi-state phase change device that includes selecting a desired threshold voltage (Vth) from a multiple desired Vths. Each one of the desired Vths corresponding to one of a multiple data values. A programming pulse is also applied to a phase change material in the phase change device including applying a quantity of energy to the phase change material to drive at least a portion of the phase change material above a melting energy level. The quantity of energy being applied for a first time interval. A portion of the energy applied to the phase change material is allowed to dissipate below the melting energy level. A shape of energy dissipation from the phase change material is controlled until the energy applied to the phase change material is less than a quenched energy level. The shape of the energy dissipation is controlled to cause the phase change device to have the desired Vth. A remaining portion of the energy applied to the phase change material is allowed to dissipate to an environmental level.

The quantity of the energy applied to the phase change material is a function of an operating parameter. The quantity of the energy applied to the phase change material is a function of a phase change manufacturing process variable.

Yet another embodiment provides a method of programming a memory array. The method includes selecting a desired threshold voltage (Vth) and applying a programming pulse to a phase change memory device in the memory array. A steering element can apply the programming pulse to the phase change memory device including applying a quantity of energy to the phase change device to drive at least a portion of a phase change material in the phase change device above a melting energy level. The quantity of energy is applied for a first time interval. A portion of the energy applied to the phase change material is allowed to dissipate below the melting energy level. A shape of energy dissipation from the phase change material is controlled until the energy applied to the phase change material is less than a quenched energy level. The shape of the energy dissipation is controlled to cause the phase change device to have the desired Vth. A remaining portion of the energy applied to the phase change material is allowed to dissipate to an environmental level.

The desired Vth level is one of multiple desired Vth levels and each one of the desired Vth levels corresponds to one of multiple desired data values. The quantity of the energy applied to the phase change material can be a function of an operating parameter. The quantity of the energy applied to the phase change material can be a function of a phase change manufacturing process variable.

The disclosed invention provides the advantage of being able to accurately compensate for process variations, operating parameter variations, and accurately programming different resistance levels in a phase change device.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIGS. 2A-2H show various programming energy pulse profiles, in accordance with one or more embodiments of the present invention.

DETAILED DESCRIPTION OF THE EXEMPLARY EMBODIMENTS

Figure 1:
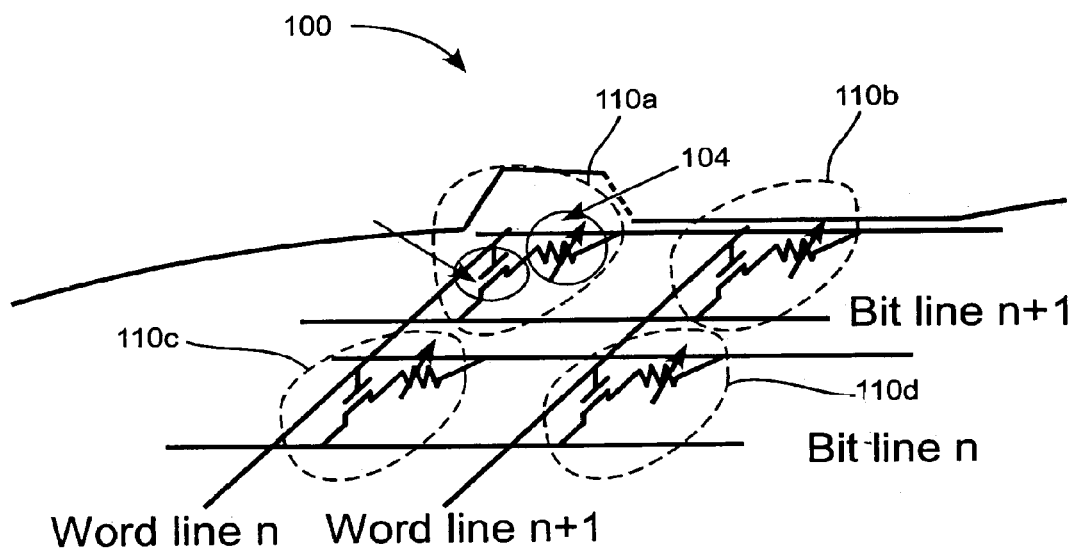
FIG. 1 shows a phase change memory cell array.

Several exemplary embodiments for a system and method for accurately and quickly programming multiple threshold voltage levels in a phase change device will now be described. It will be apparent to those skilled in the art that the present invention may be practiced without some or all of the specific details set forth herein.

Phase change devices can be read and programmed very quickly and do not require power to maintain their state. Therefore, phase change devices are very useful devices for storing data (e.g., as a computer memory device). Further, because a wide range of different threshold voltages exist between the amorphous state and the crystalline state, then the threshold voltage can be separated into multiple levels and each one of the multiple threshold voltage levels could be used to indicate a different data value that is stored in the phase change device.

One embodiment provides a system and method for a precise selection of each one of the multiple threshold voltage levels for a phase change device. The precise selection of the multiple threshold voltage levels for the phase change device therefore provides a precise control of the selection of the threshold voltage (Vth) level required that corresponds to each one of the multiple data values that can be stored in the phase change device. The precise selection of each one of the multiple threshold voltage levels for the phase change device can also provide an improved programming method that reduces the variation of Vth. The reduced variation of Vth increases stability in different operating conditions (e.g., temperature, current, input voltage, etc.) and can also compensate for semiconductor manufacturing process variations (e.g., film thickness variations, phase change material variations, phase change contact size, etc.).

In one embodiment, the threshold voltage of a phase change device can be selected for a relatively small number (e.g., 4) of multiple resistance levels. For example, the resistance levels can include four levels of resistance (e.g., 5 k, 50 k 500 k and 5M ohm). However, it can be difficult to accurately detect each of the different resistance levels. By way of example, if 0.1 V read voltage is applied on a phase change device with resistance at the four different states described above, the resulting current would be 20 uA, 2 uA, 0.2 uA, and 20 nA, respectively. It can be very difficult to accurately detect all four of the different Vth levels as 0.2 uA is a very low current, and 20 nA is the same order of magnitude of current flow as noise in a typical phase change device circuit.

The resistance level, and therefore the Vth level, of a phase change device can be decided by the state of the phase change material in the phase change device. The state of phase change material is a description of a quantity of the phase change material that is changed from the amorphous state to the crystalline state. The quantity of the phase change material that is changed determines the resistance of phase change material and the threshold voltage of the phase change device. The state of the phase change material is mostly determined by the quench rate (i.e., how rapidly the phase change material cools from a melted state back to a solid form. However, the quench rate is also strongly dependent on the operating conditions (e.g., temperature, input voltage, etc.) and process variations (e.g., film thickness, phase change contact size, etc.). In one embodiment, the profile of the programming energy pulse can quench the phase change material in the phase change device to a produce a desired threshold voltage level, with minimum sensitivity to the operating conditions and process variations.

Below threshold voltage (Vth) the current flow through the phase change device is very low. Conversely, above Vth, the current flow through the phase change device is much larger. By way of example, the typical on/off ratio can be greater than about 1000 times. The current difference between on and off conditions is very clear. By sensing the current difference, the on or off condition of the phase change device can be easily and quickly distinguished.

One embodiment provides a programming method that can achieve precise Vth control. FIG. 1 shows a phase change memory cell array 100. Four memory cells 110a-110d are included in the memory cell array 100. The memory cell 110a includes a transistor 102, as a steering element, and one phase change device 104 as a memory element. Turning on the steering element 104 and applying sufficient programming energy pulse can program the phase change device 102.

The programming energy pulse that has a profile that describes the shape of the pulse. FIGS. 2A-2H show various programming energy pulse profiles 205-240, in accordance with one or more embodiments of the present invention. The programming energy pulse profiles 205-240 have the voltage shown in the vertical axis and time on the horizontal axis. It should be understood that the vertical axis could also show the current, energy, heat, light or other type of energy of the respective pulse profiles 205-240. The profile can be square 205, triangle 210, stairs 215, trapezoid 220, trapezium 225, square with straight sloping trailing edge 230 or tail pattern, square with u-shaped tail pattern 235, or a square with a reverse u-shaped tail pattern 240, or other complex patterns.

The voltage of the programming energy pulse can be from about 0.01 V to about 20 V. The waveform (i.e., shape or profile) of the programming energy pulse can be from about 1 ns to about 10 us and from about a maximum energy amplitude to a minimum energy amplitude. Each different programming energy pulse can result in a different resistance level and a different Vth.

By way of example, a programming energy pulse with a square profile with a straight sloping tail pattern (e.g., profile 230 of FIG. 2F). The duration of the main square portion of the pulse (i.e., from t0 to t1) can range from about 0 ns to about 1000 ns. By changing the slope (i.e., shape) of the tail portion (i.e., from t1 to t2 as shown in programming energy pulse 230), the resistance level and the Vth of the phase change device 102 can be accurately selected. By way of example, the programming energy pulse 205 has vertical tail and results in a first resistance level and a first Vth. In contrast, the programming energy pulse 230 has the same voltage as pulse 205 but also has a straight, sloping tail that extends from t1 to t2 as opposed to the vertical tail on pulse 205. Programming energy pulse 230 results in a second resistance level and a second Vth.

Figure 3:
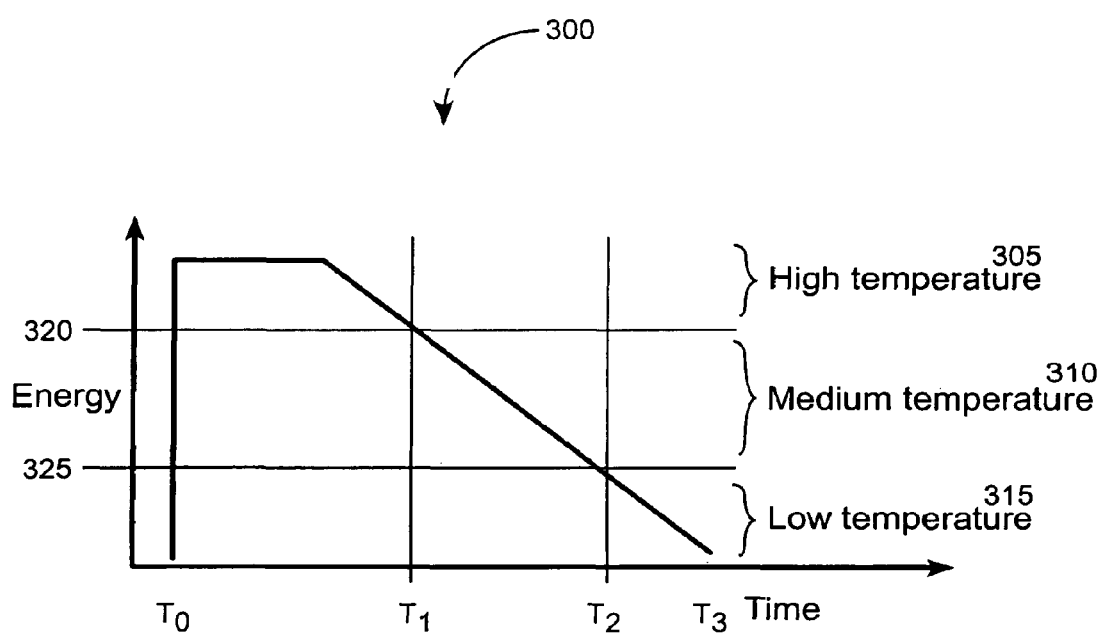
FIG. 3 shows a programming pulse profile, in accordance with one embodiment of the present invention.

FIG. 3 shows a programming pulse profile 300, in accordance with one embodiment of the present invention. The programming pulse profile 300 has three portions: melting 305, phase change 310, and the solid cooling 315. In the melting portion 305, between t1 and t2, the input pulse provides sufficient energy to cause the phase change material to melt. In the phase change portion 310, between t1 and t2, the applied energy is reduced (as compared to the melting portion 305) and the phase change film is quenched at a selected cooling speed. The cooling speed is controlled by the shape of the pulse as phase change material cools from the melting temperature 320 to the quenched temperature 325, and thus determines the resistance level and the Vth of the phase change device. In the solid cooling portion 315, between t2 and t3, the phase change material cools to the operating temperature of the operating environment. Since the operating temperature is lower than the melting temperature 320 of the phase change device and also cooler than the quenched temperature 325, then the resistance level of the phase change device is not significantly changed from the previous phase change portion 310.

The resistance level and Vth is determined by the shape of the energy pulse during the cooling portion 315 and therefore the environmental temperature or the given energy can also impact how the phase change device is quenched. In one embodiment, the programming pulse profile is selected so that the cooling portion 315 is controlled independent from the operation conditions and process variations. By precisely selecting the cooling portion 315, different resistance levels and different Vths can be selected.

Figure 4:
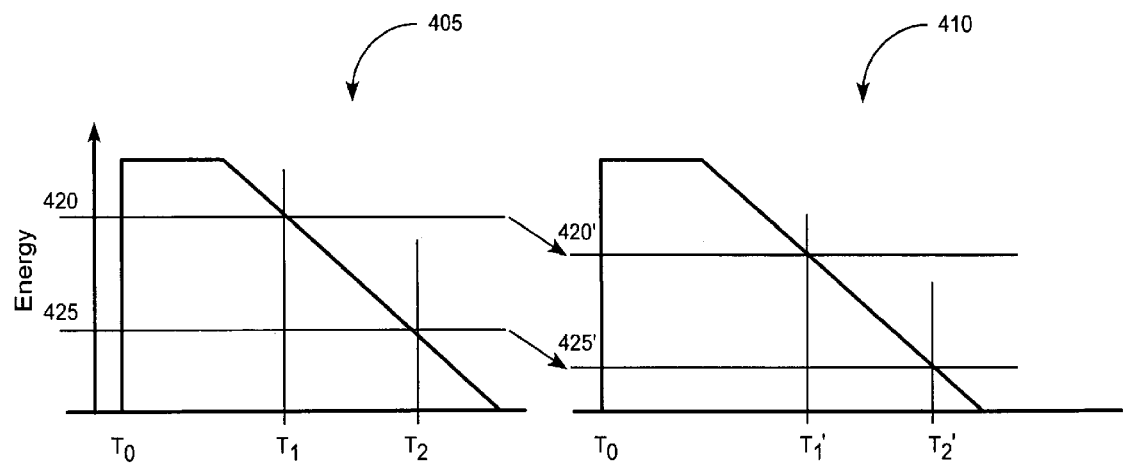
FIG. 4 shows two views of the same programming pulse, in accordance with one embodiment of the present invention.

A square programming pulse 205 of FIG. 2A above is difficult to use for selecting different resistance levels and Vths because the quenching of the phase change device is highly dependent on the environmental conditions. FIG. 4 shows two views 405 and 410 of the same programming pulse, in accordance with one embodiment of the present invention. In both views 405 and 410, the pulse height and durations are the same. However, in view 410, the operating temperature is elevated as compared to view 405. As a result, the amount of energy 420' required to reach melting temperature is less in view 410 as compared to energy level 420 in view 405. Further, more energy must be dissipated to fall below the energy level 420'. As a result, the interval between t0 and t1' of view 410 is longer than the interval between t0 and t1 of view 405. Further, the amount of energy required to be dissipated from peak energy to quenched energy level 425' is also increased in view 410 as compared to view 405. As a result, as the environmental conditions change, a different resistance level and a different Vth can result from the same programming pulse profile 405 and 410. The quench energy shape can be controlled by the programming pulse profile to compensate for variations in environmental conditions such as operating temperature.

By way of example, the slope of the tail portion (i.e., between time t1 and time t2 and between melting energy level 420 and quenched energy level 425 of the programming pulse profile) can be tightly controlled to select a desired resistance level and Vth that is independent of the operating conditions. In a stair-stepped profile 215 or a sloping tail such as in pulse profiles 210, 225, 230, 235, 240, time or duration of the tail portion of the programming pulse profile is a significant component. Conversely, the tail portion of the programming pulse 205 is almost non-existent as tailing edge of the pulse is mostly vertical. Therefore, the sloping tail of pulse profiles 210, 225, 230, 235, 240 provide a control element to the select the resulting resistance level and Vth of the phase change device.

Aspects (e.g., duration, stair height, number of steps, step duration, combinations of different tail profiles, etc.) of the sloping tail of pulse profiles 210, 225, 230, 235, 240 can be manipulated to select the resulting resistance level and Vth of the phase change device. It should be noted that the resistance level and Vth of the phase change device can be selected independently of one another. Restated, a first energy pulse profile can result in a first resistance level and a first Vth level of the phase change device. A second energy pulse profile can result in the first resistance level and a second Vth level of the phase change device. Similarly, a third energy pulse profile can result in a second resistance level and the first Vth level of the phase change device.

Figure 5:
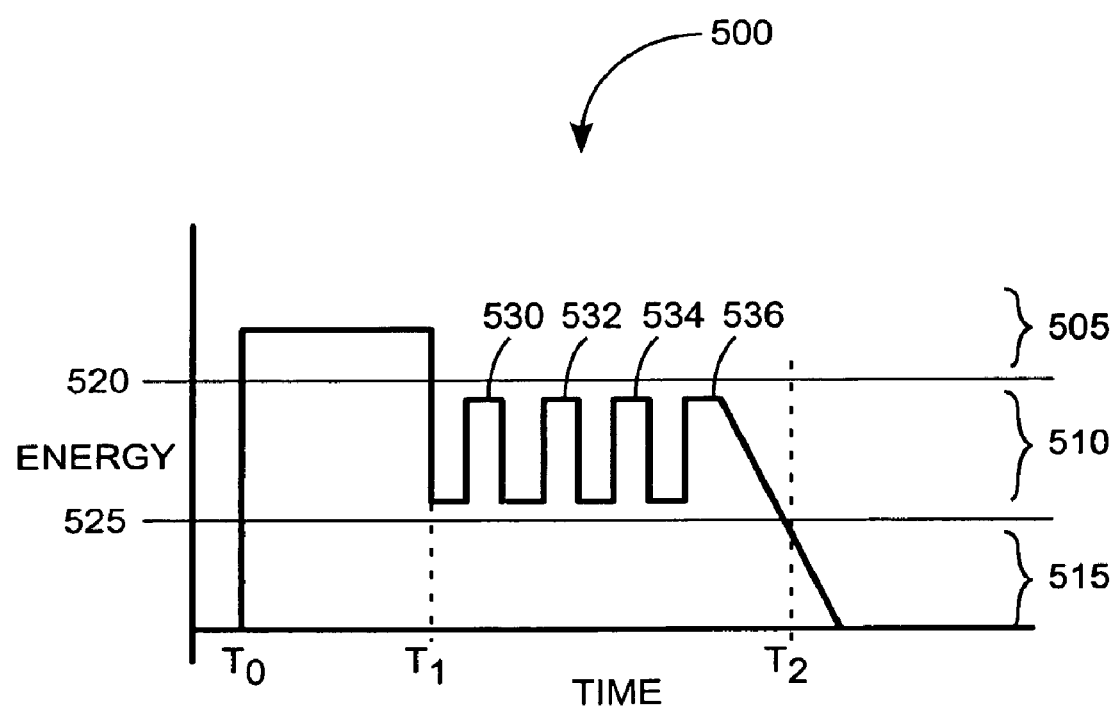
FIG. 5 shows a combination pulse profile, in accordance with one embodiment of the present invention.

FIG. 5 shows a combination pulse profile 500, in accordance with one embodiment of the present invention. The combination pulse profile 500 includes a high temperature melting portion 505 that is bounded by the melting energy level 520 and between t0 and t1. Multiple sub-pulses 530-536 of energy are applied to maintain or extend the time that the phase change material is within the phase change portion 510. The multiple sub-pulses 530-536 of energy allow a desired resistance and corresponding Vth to be selected. The cooling portion 515 allows the phase change material to cool to the environmental operating temperature.

Figure 6:
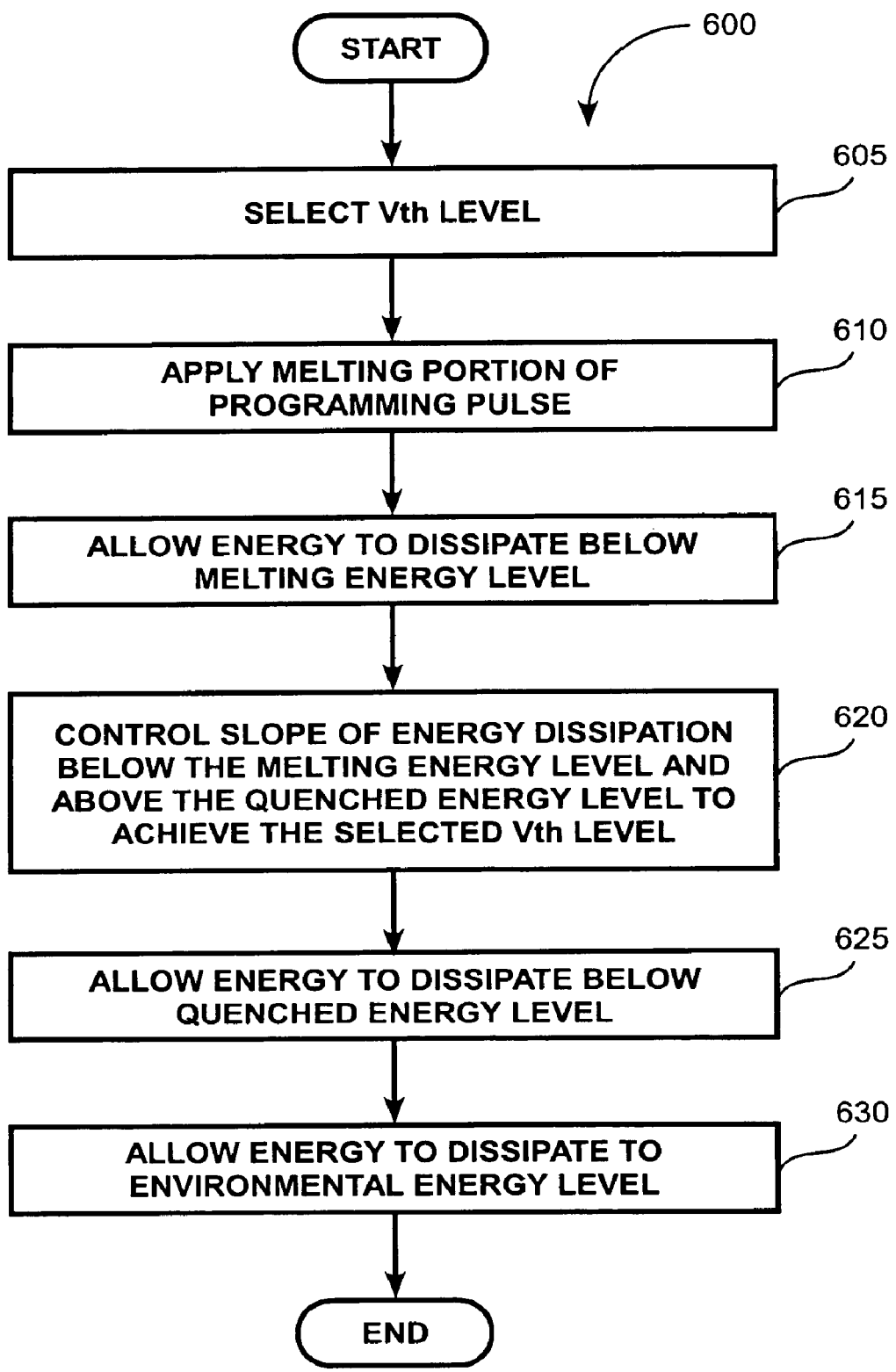
FIG. 6 is a flowchart of the method operations of programming a phase change device in accordance with one embodiment of the present invention.

FIG. 6 is a flowchart of the method operations 600 of programming a phase change device in accordance with one embodiment of the present invention. In an operation 605, a desired resistance level and/or a desired Vth is selected. In an operation 610, a programming pulse is applied to the phase change material. The programming pulse includes a melting portion, a phase change (i.e., quenching) portion and a cooling portion. In operation 610, the melting portion of the programming pulse is applied to the phase change material. In an operation 615, a portion of the energy applied to the phase change material is allowed to dissipate below a melting energy level.

In an operation 620, a shape of the energy dissipation from the phase change material is controlled so that the selected resistance level and/or a selected Vth is achieved. In an operation 625, the energy is allowed to dissipate below a quenched energy level. In an operation 630, the energy is allowed to dissipate to the level of the environment (i.e., operating temperature) and the method operations can end.

Figure 7:
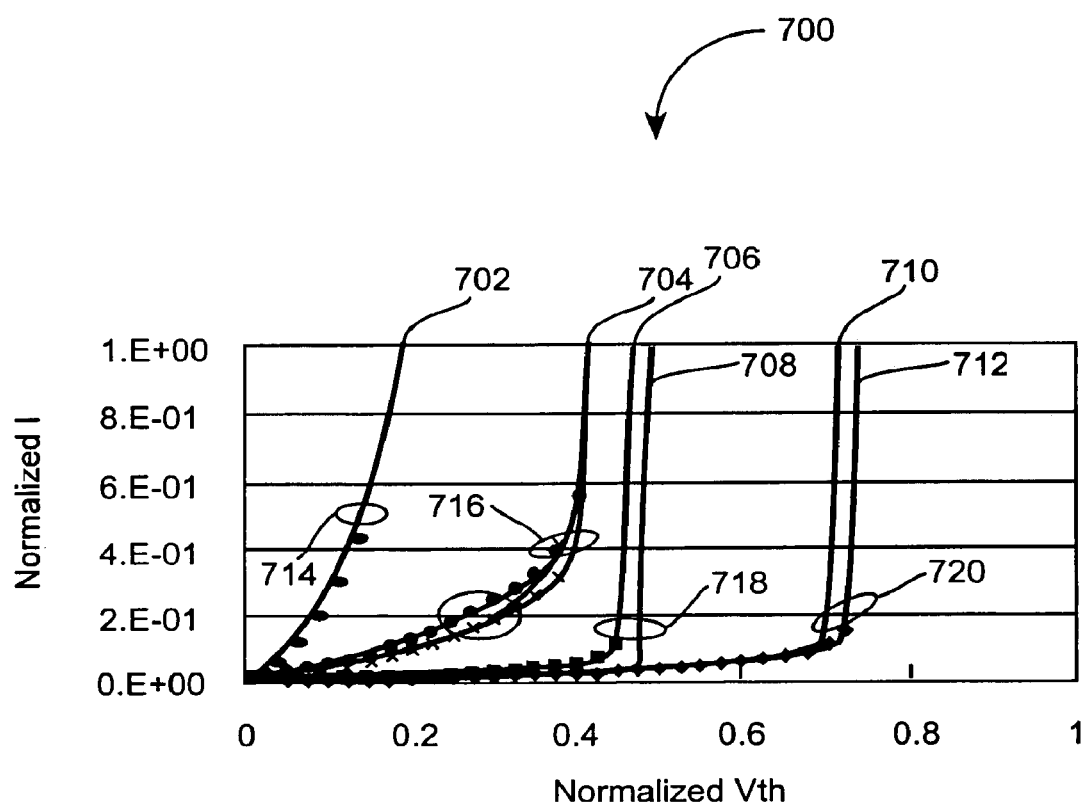
FIG. 7 shows a graphical representation of multiple Vth levels that can be programmed into a phase change device, in accordance with one embodiment of the present invention.

FIG. 7 shows a graphical representation 700 of multiple Vth levels that can be programmed into a phase change device, in accordance with one embodiment of the present invention. The normalized current is shown on the vertical axis and the normalized Vth is shown on the horizontal axis. As shown by the graphs 702-712, when the respective Vth level 714-720 is exceeded the current flow through the phase change device increases approximately vertically. By way of example, graph 702 shows that when a first Vth level 714 is met, the current flow through the phase change device increases approximately vertically. Similarly, if a second Vth level 716 is desired, then the phase change device can be programmed so that current flow increases at the second Vth level 716. As described above, a Vth can be selected and therefore the Vth range between a low Vth level 714 and a high Vth level 720 can be divided into multiple Vth levels, each one of the multiple Vth levels can indicate a different data value. As described above, a phase change device can be used as a multi-state device.

It should be understood that while the phase change device 102 is shown in an array structure in FIG. 1 above, it should be understood that the present invention is not limited to phase change devices in an array structure or even phase change devices paired with a steering element (e.g., steering element 104). The present invention can be used to select and control a resistance level and a Vth level of any type of phase change device. The impact of operation condition and process variation can also be minimized and/or compensated for.

As used herein in connection with the description of the invention, the term "about" means+/−10%. By way of example, the phrase "about 250" indicates a range of between 225 and 275. With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory device comprising:
 a memory cell programmable to a plurality of resistance states; and
 bias circuitry adapted to apply a bias arrangement to the memory cell, the bias arrangement including a voltage pulse having a first voltage height via provision of an input energy and a second voltage height, the second voltage height being smaller than the first voltage height to establish one of the plurality of resistance states corresponding to a data value at a selected cooling speed via provision of a reduced input energy compared to the input energy.

2. The device of claim 1, wherein the voltage pulse includes a plurality of sub-pulses.

3. The device of claim 2, wherein sub-pulse has a profile of at least one of a square, a triangle, one or more stairs, a trapezoid, a trapezium, a square with straight sloping pattern, a square with u-shaped tail pattern, a square with a reverse u-shaped tail pattern, and a combination thereof.

4. A phase change memory device comprising:
   a phase change memory cell having a phase change material programmable to a plurality of resistance states; and
   bias circuitry adapted to apply a bias arrangement to the phase change memory cell, the bias arrangement including a voltage pulse having a first voltage height to bring the phase change material over a melting temperature via provision of an input energy and a second voltage height, the second voltage height being smaller than the first voltage height to establish one of the plurality of resistance states corresponding to a data value at a selected cooling speed via provision of a reduced input energy compared to the input energy.

5. The device of claim 4, wherein the phase change material includes a chalcogenide material.

\* \* \* \* \*